(12) United States Patent
Takahashi

(10) Patent No.: US 8,656,259 B2
(45) Date of Patent: Feb. 18, 2014

(54) DATA TRANSMISSION

(75) Inventor: Tsugio Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 122 days.

(21) Appl. No.: 13/317,782

(22) Filed: Oct. 28, 2011

(65) Prior Publication Data

US 2012/0117447 A1 May 10, 2012

(30) Foreign Application Priority Data

Nov. 5, 2010 (JP) ................................. 2010-248542

(51) Int. Cl.
*H03M 13/00* (2006.01)

(52) U.S. Cl.
USPC ......................................................... 714/777

(58) Field of Classification Search
USPC .................. 714/777, 752, 786, 799
See application file for complete search history.

(56) References Cited

U.S. PATENT DOCUMENTS

| | | | | |
|---|---|---|---|---|
| 5,847,666 A * | 12/1998 | Yasoshima et al. | ............. | 341/58 |
| 7,061,408 B2 * | 6/2006 | Poechmueller | ................. | 341/55 |
| 8,301,969 B2 * | 10/2012 | Unno et al. | .................... | 714/758 |
| 8,306,156 B2 * | 11/2012 | Zhang | ............................ | 375/329 |
| 8,355,634 B2 * | 1/2013 | Ota et al. | ........................ | 398/75 |
| 8,405,529 B2 * | 3/2013 | Chang | .............................. | 341/55 |
| 2006/0136800 A1 * | 6/2006 | Kawabata et al. | ............ | 714/763 |
| 2007/0050658 A1 * | 3/2007 | Kuwata | ......................... | 713/503 |
| 2007/0255981 A1 * | 11/2007 | Eto | ................................ | 714/710 |

FOREIGN PATENT DOCUMENTS

| | | |
|---|---|---|
| JP | 02-310762 A | 12/1990 |
| JP | 08-316840 A | 11/1996 |
| JP | 2001-007694 A | 1/2001 |
| JP | 2006-179131 A | 7/2006 |
| JP | 2007-257791 A | 10/2007 |

\* cited by examiner

*Primary Examiner* — Albert Decady
*Assistant Examiner* — Osman Alshack
(74) *Attorney, Agent, or Firm* — McGinn Intellectual Property Law Group, PLLC

(57) ABSTRACT

If the number of bits at which 64-bit width data has changed at the same time has exceeded a threshold, the data is outputted, with the polarity of each bit inverted. Otherwise, the data is outputted. A 7-bit width error correcting code is given to the outputted data and the inversion instruction signal indicating whether the number of the changed bits has exceeded the threshold. Error code correction is performed for the data and the inversion instruction signal with the use of the transmitted error correcting code. If the inversion instruction signal for which the error code correction has been performed indicates that the number of the changed bits has exceeded the threshold, the data for which the error code correction has been performed is outputted, with the polarity of each bit inverted. Otherwise, the data for which the error code correction has been performed is outputted.

19 Claims, 6 Drawing Sheets

DATA TRANSMISSION

This application is based upon and claims the benefit of priority from Japanese Patent Application No. 2010-248542 filed on Nov. 5, 2010, the content of which is incorporated by reference.

BACKGROUND OF THE INVENTION

1. Field of the Invention

The present invention relates to a data transmission system which transmits data, a transmission circuit and a reception circuit.

2. Description of the Related Art

Recently, the signal capacity of a communication IC (integrated circuit) has increased tremendously, and has reached a stage of transition from 40 Gbps to 100 Gbps in the practical area. Furthermore, 400 Gbps is going to be examined in the research area.

On the other hand, the processing clock frequency inside the IC has not kept up with this trend. That is, since it is not possible to perform processing using a high-speed clock inside the IC, processing of the signal is performed after an inputted high-speed signal is converted to a parallel signal to decrease the clock frequency.

Parallel conversion of a high-speed signal will be described below, with the case where the clock frequency inside an IC is 156 MHz in a SONET (Synchronous Optical NETwork)/SDH (Synchronous Digital Hierarchy) apparatus as an example.

In the case of a signal speed of 10 Gbps, it is necessary to convert the signal to a 64-bit width parallel signal inside the IC (10 Gbps/156 MHz=64 bits). In the case of a signal speed of 40 Gbps, it is necessary to convert the signal to a 256-bit width parallel signal inside the IC (40 Gbps/156 MHz=256 bits). Furthermore, in the case of a signal speed of 100 Gbps, it is necessary to convert the signal to a 640-bit width parallel signal inside the IC (100 Gbps/156 MHz=640 bits). Thus, as the signal speed is higher, the bit width of a parallel signal increases.

In the case where such a high-speed signal is latched by one stage by FFs (flip-flops) in the IC, 256 FFs are required for performing latching by only one stage if the signal speed is, for example, 40 Gbps. Therefore, the maximum number of synchronous output operations of the FFs is 256.

Furthermore, since a complicated logic is taken in the IC, more sets of FFs exist in the IC as the logic is deeper, and the number of synchronous operations further increases.

Therefore, as the communication capacity (communication speed) increases, switching noise due to the synchronous operations of the FFs inside the IC significantly increases. Consequently, there is a possibility that the switching noise cannot be suppressed no matter how many bypass capacitors for a power source line implemented outside the IC are added.

In the case of a CMOS-IC, power consumption inside the IC is proportional to the number of signal changes of the FFs. Therefore, as the number of synchronous operations increases, the power consumption of the IC increases.

Accordingly, there is widely known a method of reducing the number of synchronous operations by adding a 1-bit inversion instruction signal to a parallel signal (for example, see JP H02-310762A).

Referring to FIG. 1, there is disclosed a circuit disclosed in JP H02-310762A in which the number of synchronous operations for each clock is counted in comparison/judgment circuit 17, a polar signal is created in polar signal creation circuit 32 if the number of synchronous operations exceeds a criteria value, and the polarity of data is inverted with the use of the polar signal.

In recent fine processes, it is common to apply an ECC (Error Checking and Correction) circuit as a measure for memory soft errors (for example, see JP2006-179131A).

FPGA (Field Programmable Gate Array) manufacturers have a tendency to prepare a 72-bit width memory (RAM; Random Access Memory) as a standard, in consideration of applying this ECC circuit to an FPGA. This is because an 8-bit width ECC code correcting code is added to a 64-bit width main signal, so that the total bit width is 72 bits.

SUMMARY OF THE INVENTION

However, when an attempt is made to apply the method as described in JP H02-310762A to an FPGA equipped with an ECC circuit, the following problems occur.

In the case of a 64-bit width main signal, when an 8-bit width signal given by the ECC circuit is added, the total bit width becomes 72 bits. When a 1-bit inversion instruction signal is further added thereto, the total bit width becomes 73 bits, and there is a problem in which the method cannot be used in a 72-bit width RAM released as a standard as described before. In the case of a signal speed of 40 Gbps also, the use efficiency of the RAM similarly significantly deteriorates.

Furthermore, in the method described in JP H02-310762A (in which an ECC circuit is not equipped), a main signal is inverted on a decoding side if an error occurs in the 1-bit width inversion instruction signal for some reason. Therefore, for example, in the case of a 64-bit parallel signal, all the 64 bits are erroneous, and there is a possibility that a problem of system reliability will occur.

The object of the present invention is to provide a data transmission system, a transmission circuit and a reception circuit that solve the above problems.

A data transmission system of the present invention is a data transmission system comprising a transmission circuit and a reception circuit, wherein the transmission circuit comprises:

a judgment section that generates a 1-bit width inversion instruction signal indicating whether or not a number of bits at which data has changed at the same time, among inputted 64-bit width data, has exceeded a predetermined threshold;

a transmission data output section that outputs the data, with the polarity of each bit inverted, if the inversion instruction signal indicates that the number of the changed bits has exceeded the threshold and, otherwise, outputs the data without inverting the polarity;

an instruction signal output section that outputs the inversion instruction signal at the timing of the output from the transmission data output section;

an error code giving section that gives a 7-bit width error correcting code to the data outputted by the transmission data output section and to the inversion instruction signal outputted by the instruction signal output section; and a transmission section that transmits the data outputted by the transmission data output section, the inversion instruction signal being outputted by the instruction signal output section and the error correcting code to the reception circuit; and the reception circuit comprises:

an error code correction section that performs error code correction for the data and inversion instruction signal transmitted from the transmission circuit using the error correcting code transmitted from the transmission circuit; and a received data output section that outputs the data for which the error code correction has been performed, with the polarity of each bit inverted, if the inversion instruction signal for which the error code correction has been performed indicates that the number of the changed bits has exceeded the threshold and, otherwise, outputs the data for which the error code correction has been performed.

A transmission circuit of the present invention is a transmission circuit that transmits predetermined data to a reception circuit, the transmission circuit comprising:

a judgment section that generates a 1-bit width inversion instruction signal indicating whether or not a number of bits at which data has changed at the same time, among inputted 64-bit width data, has exceeded a predetermined threshold;

a transmission data output section that outputs the data, with the polarity of each bit inverted, if the inversion instruction signal indicates that the number of the changed bits has exceeded the threshold and, otherwise, outputs the data without inverting the polarity;

an instruction signal output section that outputs the inversion instruction signal at the timing of the output from the transmission data output section;

an error code giving section that gives a 7-bit width error correcting code to the data outputted by the transmission data output section and to the inversion instruction signal outputted by the instruction signal output section; and a transmission section that transmits the data outputted by the transmission data output section, the inversion instruction signal being outputted by the instruction signal output section and the error correcting code to the reception circuit.

A reception circuit of the present invention is a reception circuit that receives data transmitted from a transmission circuit that transmits data, the reception circuit comprising:

an error code correction section that performs error code correction for 64-bit width data transmitted from the transmission circuit and a 1-bit width inversion instruction signal indicating whether or not a number of bits at which the data has changed at the same time has exceeded a predetermined threshold, using a 7-bit width error correcting code transmitted from the transmission circuit; and a received data output section that outputs the data for which the error code correction has been performed, with the polarity of each bit inverted, if the inversion instruction signal for which the error code correction has been performed indicates that the number of the changed bits has exceeded the threshold and, otherwise, outputs the data for which the error code correction has been performed.

As described above, in the present invention, it is possible to efficiently use RAM, suppress noise and reduce power consumption, and enhance the reliability of data in a 72-bit RAM device.

The above and other objects, features, and advantages of the present invention will become apparent from the following description with reference to the accompanying drawings which illustrate an example of the present invention.

EXEMPLARY EMBODIMENT

An exemplary embodiment will be described below with reference to drawings.

A data transmission system of the present invention includes a circuit on the side of giving an error correcting code (hereinafter referred to as a transmission circuit) and a circuit on the side of performing error correction of data transmitted from the transmission circuit using an error correcting code (hereinafter referred to as a reception circuit).

First, the transmission circuit will be described.

Figure 1:
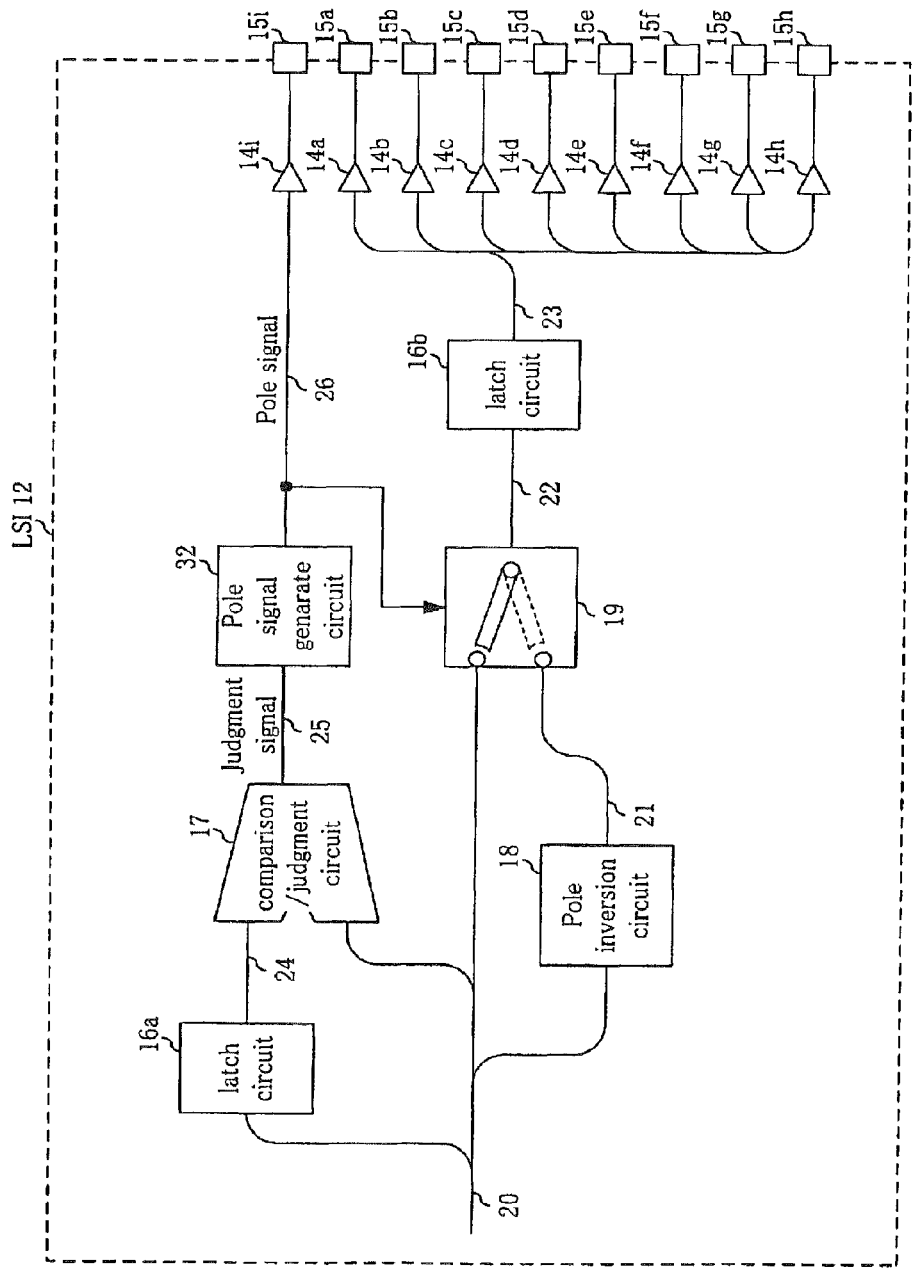
FIG. 1 is a diagram showing a circuit disclosed in JP H02-310762A.
Figure 2:
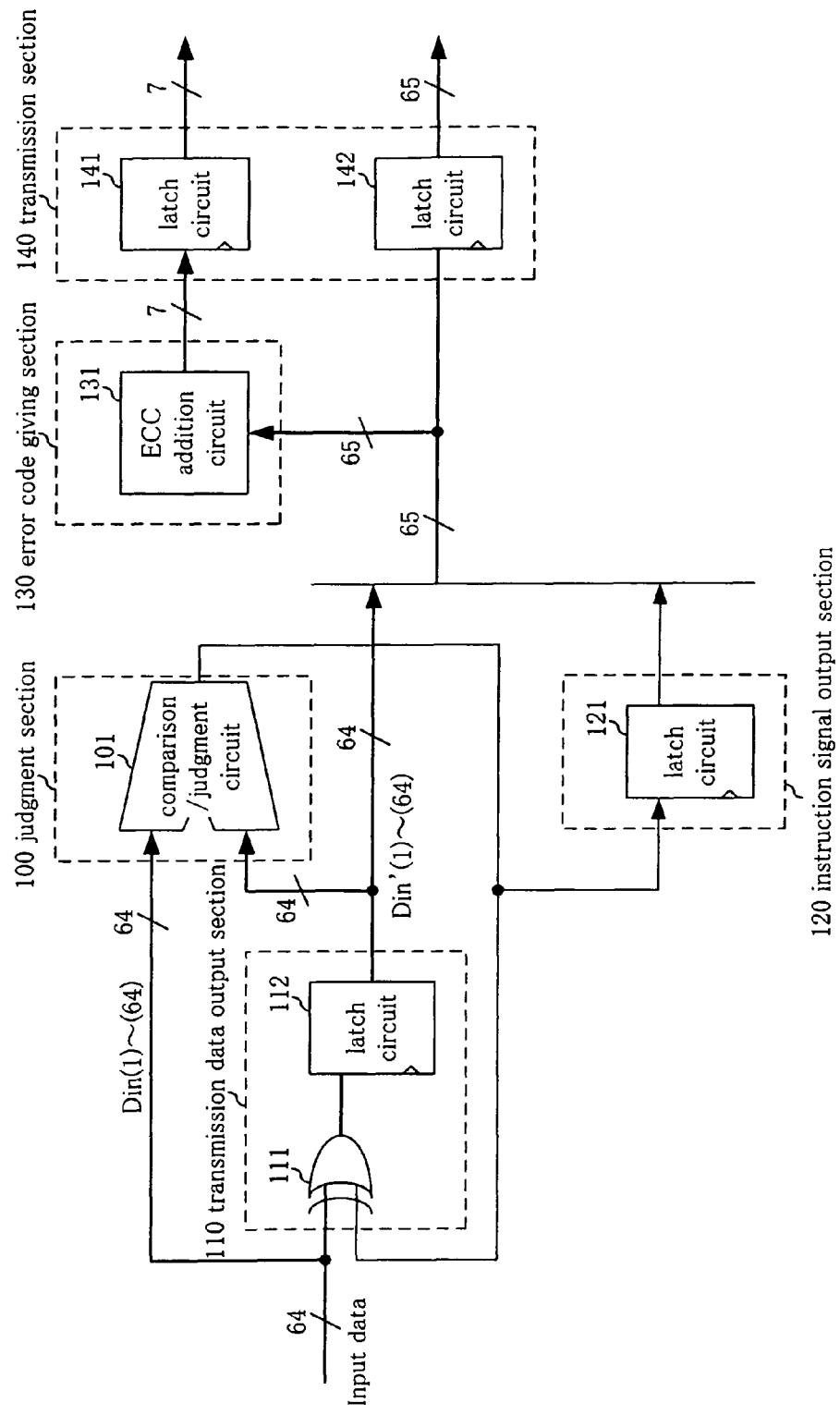
FIG. 2 is a diagram showing an exemplary embodiment of a transmission circuit in a data transmission system of the present invention.

Referring to FIG. 2, there is disclosed a transmission circuit provided with judgment section 100, transmission data output section 110, instruction signal output section 120, error code giving section 130 and transmission section 140.

Judgment section 100 includes comparison/judgment circuit 101, and it judges whether or not the number of bits at which data has changed at the same time, among inputted 64-bit width data Din (1) to (64), has exceeded a predetermined threshold. This predetermined threshold is a value set in advance and may be, for example, a value corresponding to half the width of the inputted data, that is, "32" here. Whether or not the data has changed or not can be judged by comparing, for each bit, the inputted data with what is obtained by delaying the inputted data by one clock at transmission data output section 110, as shown in FIG. 2.

Judgment section 100 generates a 1-bit width inversion instruction signal indicating a result of the judgment. In this case, if the number of changed bits exceeds the threshold as a result of the judgment, judgment section 100 generates a high-level inversion instruction signal. If the number of the changed bits is equal to or below the threshold as a result of the judgment, judgment section 100 generates a low-level inversion instruction signal.

Figure 3:
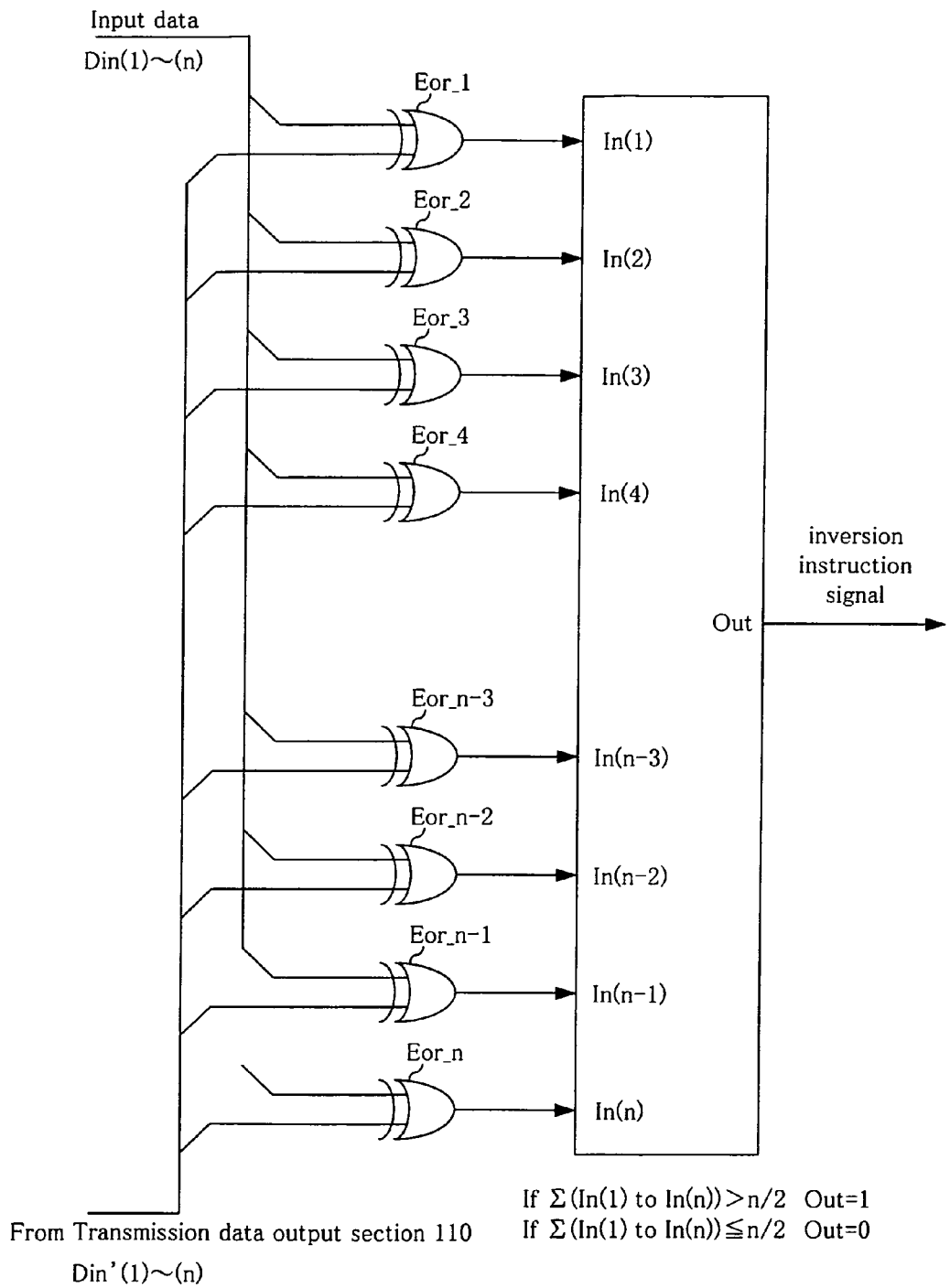
FIG. 3 is a diagram showing an example of the internal configuration of a comparison/judgment circuit shown in FIG. 2.

Comparison/judgment circuit 101 shown in FIG. 2 compares, between the input data (Din (1) to (n)) (n is an integer) and data outputted from transmission data output section 110 (Din' (1) to (n)), each pair of corresponding bits of the n-bit width data, as shown in FIG. 3. If the total number of pairs of bits different from each other exceeds n/2 as a result of the comparison, comparison/judgment circuit 101 generates and outputs "1" as an inversion instruction signal. On the other hand, if the total number of pairs of bits different from each other is equal to or below n/2 as a result of the comparison, comparison/judgment circuit 101 generates and outputs "0" as an inversion instruction signal. Whether or not a pair of bits is a pair of bits different from each other is determined with the use of exclusive-OR circuits Eor_1 to Eor_n provided for the bits, as shown in FIG. 3. The logic of the exclusive-OR is the same as that of a common exclusive-OR. By comparing input data with data obtained by delaying the input data by one clock, this "pair of bits different from each other" is "a bit at which data has changed", and therefore, the total number of such bits is the number of synchronous operations.

If the inversion instruction signal generated by judgment section 100 indicates that the number of the changed bits exceeds the threshold, that is, if the level of the inversion instruction signal is a high level here, then the inputted 64-bit width data is outputted with the polarity of each bit inverted by transmission data output section 110. If the inversion instruction signal generated by judgment section 100 indicates that the number of the changed bits is equal to or below the threshold, that is, if the level of the inversion instruction signal is a low level here, the inputted 64-bit width data is outputted without inverting the polarity by transmission data output section 110. Here, it is assumed that the data outputted from transmission data output section 110 are Din' (1) to (64).

Transmission data output section 110 includes exclusive-OR circuit 111 which takes an exclusive-OR of an inputted signal and a latch circuit 112 which is an FF. By causing the inputted 64-bit width data and the inversion instruction signal generated by judgment section 100 to be inputted to this exclusive-OR circuit 111, polarity inversion processing of the data is performed. An output from exclusive-OR circuit 111 is outputted after being latched (delayed) by time corresponding to one stage of the clock by latch circuit 112.

Instruction signal output section 120 includes latch circuit 121 which is an FF. Instruction signal output section 120 outputs the inversion instruction signal outputted from judgment section 100 at the timing of output of the data from transmission data output section 110.

Error code giving section 130 includes ECC addition circuit 131. Error code giving section 130 gives a 7-bit width error correcting code to a signal with a total of 65-bit width including the 64-bit width data outputted by transmission data output section 110 and the 1-bit width inversion instruction signal outputted by instruction signal output section 120. A method of giving an error correcting code by error code giving section 130 is the same as to a common ECC addition method. Error code giving section 130 may give an error correcting code using a hamming code. Description will be made below on the number of bits of an error correcting code in the case of giving an error correcting code using a hamming code.

As for a common hamming code, a correcting code with the number of bits shown below is required.

(1) In the case of a signal with 127 bits or fewer, including main signal and code correcting bits, a 7-bit correcting code is required.

(2) In the case of a signal with 63 bits or fewer, including main signal and code correcting bits, a 6-bit correcting code is required.

(3) In the case of a signal with 31 bits or fewer, including main signal and code correcting bits, a 5-bit correcting code is required.

(4) In the case of a signal with 15 bits or fewer, including main signal and code correcting bits, a 4-bit correcting code is required.

In general, an 8-bit code correcting bit is prepared for a 64-bit signal in an FPGA. However, it is seven bits that are actually used, and the remaining one bit is for a parity code.

It is possible to detect a 2-bit error by using this parity code. However, even if detecting a 2-bit error, this detection function cannot perform code correction of the error. It is a function of merely reporting that the 2-bit error has occurred.

The phenomenon of the 2-bit error of the RAM in a soft error is generally caused by one cosmic ray inverting the values of multiple neighborhood RAM cells when passing through a RAM cell. A recent FPGA is manufactured so that a logical address is different from a physical address to cope with this 2-bit error. Thus, consideration is made so that an error of two or more bits does not occur at bits with the same address even if a 2-bit error occurs due to a soft error. As a result, the probability of occurrence of a 2-bit error is significantly low, and it is considered that the possibility of the occurrence can be ignored.

In the present invention, attention is paid to this point, and the parity signal prepared for detection of a 2-bit error is not used. For example, in the case of a 64-bit width signal, an ECC signal can be suppressed to be a 7-bit signal. Since a common RAM of an FPGA is configured by 72 bits as described above, there is one surplus bit as shown below:

$$72 \text{ bits} - 64 \text{ bits(signal)} - 7 \text{ bits(ECC code)} = 1 \text{ bit}$$

The inversion instruction signal described above is allocated to this one bit.

In this exemplary embodiment, an ECC correcting code can be given to the total of 65 bits including a main signal (64 bits) and an inversion instruction signal (one bit) (in the case of seven bits, it is possible to handle up to 127 bits including a code correcting bit). Therefore, even if an error occurs in the inversion instruction signal for some reason, the error can be corrected on a decoding side.

Transmission section 140 includes latch circuits 141 and 142. Transmission section 140 transmits the data (64 bits) outputted by transmission data output section 110, the inversion instruction signal (one bit) outputted by instruction signal output section 120 and the error correcting code (seven bits) given by error code giving section 130 to the reception circuit at the same timing adjusted with the use of latch circuits 141 and 142. If latch circuits 141 and 142 are unnecessary as a result of considering the frequency used and the like, they can be deleted.

Thus, by reducing the number of synchronous operations in 64-bit data to half of 64 or smaller, the number of synchronous operations is 40 at the most when a 64-bit width signal is inputted, as shown below:

Maximum number of synchronous operations≤(64/2)+1 (inversion instruction signal)+7 (ECC code)=40

The reception circuit will be described below.

Figure 4:
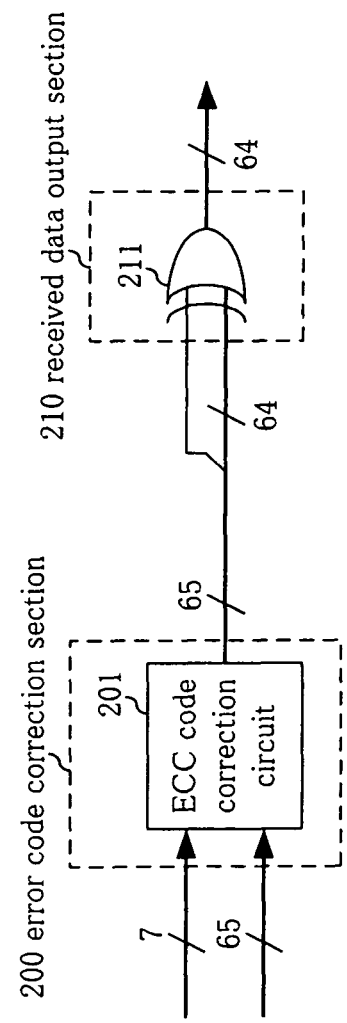
FIG. 4 is a diagram showing an exemplary embodiment of a reception circuit in the data transmission system of the present invention.

Referring to FIG. 4, there is disclosed a reception circuit including error code correction section 200 and received data output section 210.

Error code correction section 200 includes ECC code correction circuit 201. If there is an error in data or an inversion instruction signal transmitted from the transmission circuit, error code correction section 200 performs error code correction for the error using an error correcting code transmitted from the transmission circuit. Any common ECC correction process may be used as a method for this error correction.

Furthermore, 65-bit width data outputted from error code correction section 200 is separated into a 64-bit main signal and a 1-bit inversion instruction signal, and they are inputted to received data output section 210.

Received data output section 210 includes exclusive-OR circuit 211 which takes an exclusive-OR of an inputted signal. If the inversion instruction signal for which error code correction has been performed by error code correction section 200 indicates that the number of changed bits has exceeded the threshold, that is, if the level of the inversion instruction signal is a high level in this exemplary embodiment, then received data output section 210 outputs the 64-bit data for which error code correction has been performed, to the next-stage circuit (not shown), with the polarity of each bit inverted. If the inversion instruction signal for which error code correction has been performed by error code correction section 200 indicates that the number of changed bits is equal to or below the threshold, that is, if the level of the inversion instruction signal is a low level in this exemplary embodiment, then received data output section 210 outputs the 64-bit data for which error code correction has been performed to the next-stage circuit (without inverting the polarity).

An operation in this exemplary embodiment will be described below with reference to a timing chart shown in FIG. 5. Here, description will be made of a case where the bit width of inputted data is 64 bits, as an example.

Figure 5:
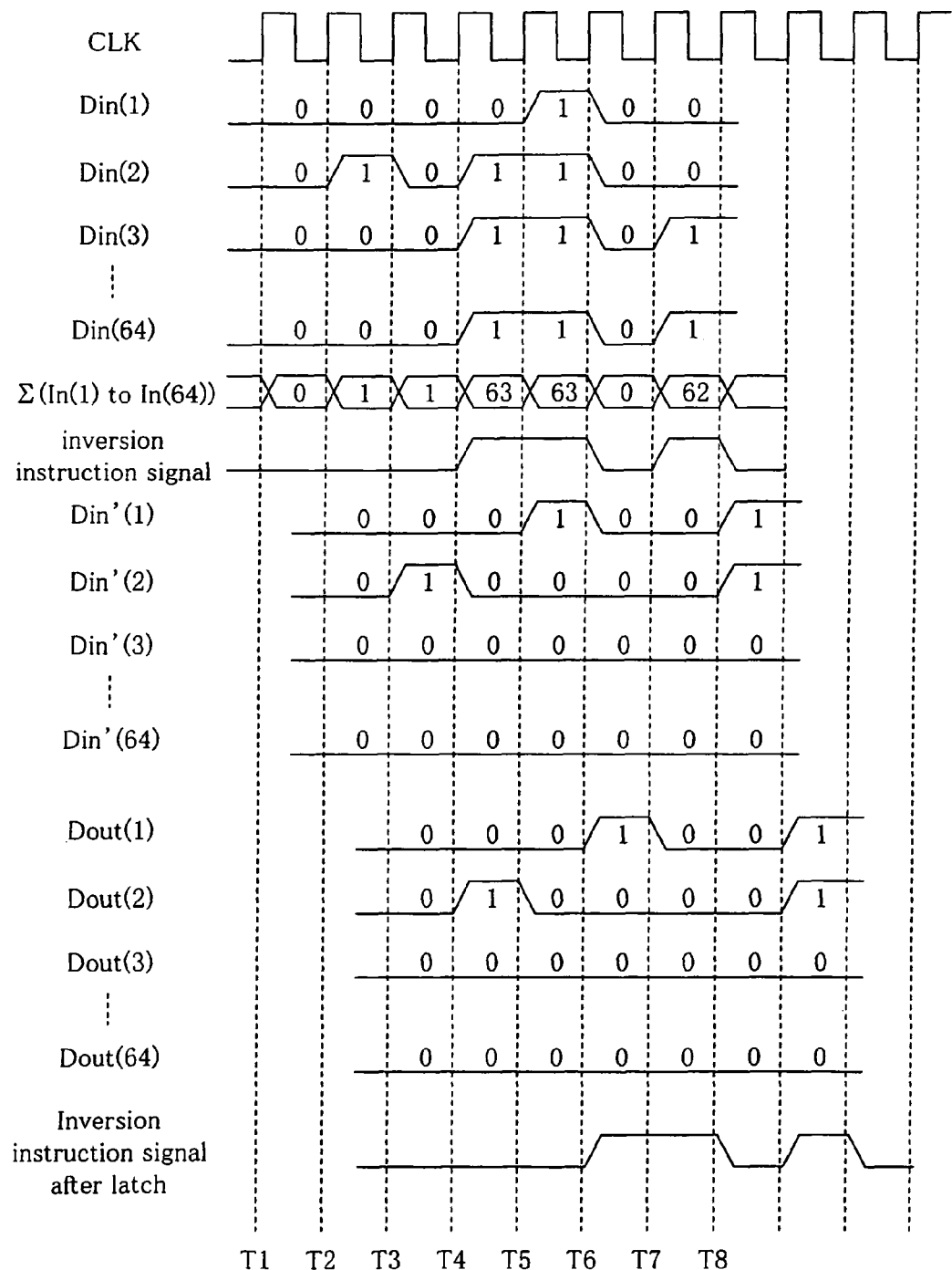
FIG. 5 is a timing chart for illustrating an operation in this exemplary embodiment.

Din (1) to (64) in FIG. 5 indicate the bits of the inputted 64-bit data. An inversion instruction signal in FIG. 5 indicates an inversion instruction signal outputted from judgment section 100. Din' (1) to (64) in FIG. 5 indicate the bits of 64-bit data outputted from transmission data output section 110. Dout (1) to (64) in FIG. 5 indicate 64-bit data outputted from transmission section 140. An inversion instruction signal after being latched in FIG. 5 indicates a 1-bit inversion instruction signal outputted from transmission section 140. In FIG. 5, $\Sigma$(In (1) to In (64)) indicates the total number of bits at which the inputted 64-bit width data has changed. That is, it indicates the number of pairs of bits different from each other when Din (1) to Din (64) and Din' (1) to (64) are compared at each timing.

As shown in FIG. 5, since the number of synchronous operations is 63, which exceeds 32 (64/2) which is the threshold at timing T4, the signal level of the inversion instruction signal is a high level. Thereby, the polarity of each bit of the inputted data Din (1) to (64) is inverted.

At timing T5, the number of synchronous operations is counted for the signal inverted at timing T4. Since the number of synchronous operations is 63, which exceeds 32 (64/2) which is the threshold at timing T5, the signal level of the inversion instruction signal is a high level. Thereby, the polarity of each bit of the inputted data Din (1) to (64) is inverted.

Thus, the judgment about whether or not the number of synchronous operations has exceeded the threshold is performed for each clock, and the number of synchronous operations of a signal is always kept at or below a threshold.

Figure 6:
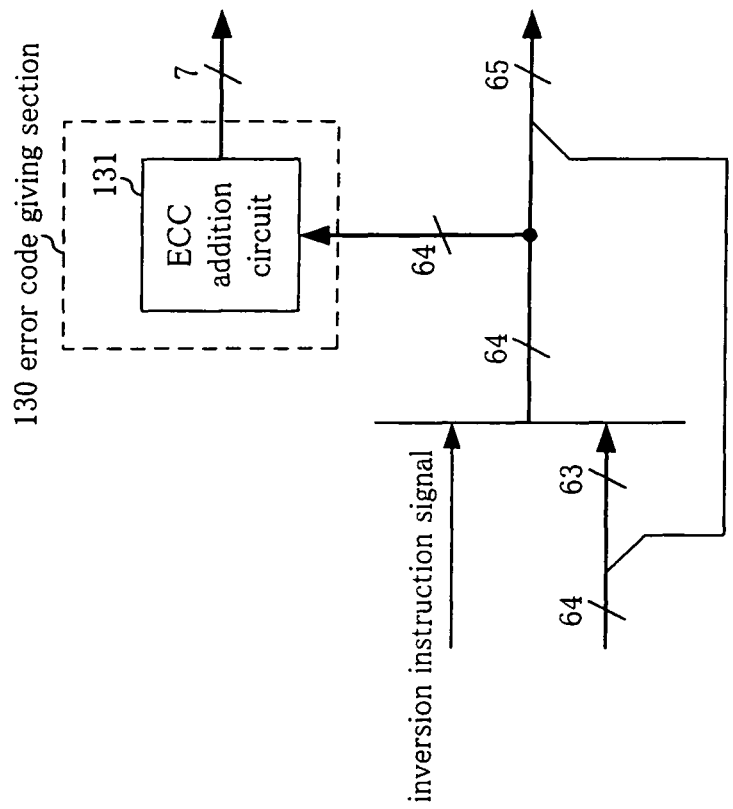
FIG. 6 is a diagram showing another exemplary embodiment of the transmission circuit in the data transmission system of the present invention.

Referring to FIG. 6, another exemplary embodiment of the transmission circuit is disclosed.

In the transmission circuit in this exemplary embodiment, the same components shown in FIG. 2 are omitted in FIG. 6. In this exemplary embodiment, a method of applying ECC addition circuit 131 is further devised.

In this exemplary embodiment, any one bit among the 64 bits of a main signal is excluded from ECC targets, and the number of bits targeted by ECC is the total of 64 bits including 63 bits of the main signal and one bit of an inversion instruction signal.

Only the one bit of the main signal is excluded from ECC targets (excluded from error correction targets), and the error correction capability deteriorates a little. However, the number of bits inputted to ECC addition circuit 131 is 64, which is a common value, and there is an advantage in which an ECC circuit released by an FPGA manufacturer can be applied.

As described above, the present invention has advantages as shown below.

A first advantage is that it is possible to suppress the number of synchronous operations of FFs operating in synchronization with a clock, to about half the signal bit width and suppress the amount of noise which occurs in synchronization with the clock (which occurs due to output change of the FFs) to about half the amount of noise which occurs in a common circuit or less.

In the case of using this signal in a logic section, the signal is used after being restored to an original value. Consequently, in this section, the number of synchronous operations is the same of the original signal. However, unlike an FF, the logic section operates after the elapse of time corresponding to addition of delay of each gate and wiring delay among gates. Therefore, switching noise is temporally distributed by occurrence of variation of switching time due to variation of the delay time. Therefore, it is not necessary to especially consider the number of synchronous operations of the logic section, and it is possible to suppress the number of synchronous operations of the IC by suppressing the synchronous operations of the FFs.

A second advantage is that power consumption in the IC can be reduced. If the number of synchronous operations is equal to or larger than half the data width, the number of synchronous operations can be suppressed to half at most. Therefore, the larger the number of synchronous operations of an original signal, the greater can be the expected effect. Actually, the effect cannot be uniquely determined because it depends on the number of synchronous operations of the original signal. However, if it is assumed that data has high randomness, reduction in power consumption by about 15% can be expected.

A third advantage is that, as for a device basically equipped with a 72-bit RAM like an FPGA, it is possible to effectively use the device without increasing the number of RAM's.

A fourth advantage is that, even if an error occurs in an inversion instruction signal for some reason, such as a soft error, it is possible to correct the error. Therefore, it is possible to improve the reliability as an apparatus by always operating normally without causing such a serious error in which all the 64 bits of a signal are caused to be wrong because of the 1-bit error, as is conventionally caused.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A data transmission system comprising a transmission circuit and a reception circuit, wherein said transmission circuit comprises:
    a judgment section that generates a 1-bit width inversion instruction signal indicating whether or not a number of bits at which data has changed at a same time, among inputted 64-bit width data, has exceeded a predetermined threshold;
    a transmission data output section that outputs the data, with a polarity of each bit inverted, if the inversion instruction signal indicates that the number of the changed bits has exceeded the threshold and, otherwise, outputs the data without inverting the polarity;
    an instruction signal output section that outputs the inversion instruction signal at a timing of the output from said transmission data output section;
    an error code giving section that gives a 7-bit width error correcting code to the data outputted by said transmission data output section and to the inversion instruction signal outputted by said instruction signal output section; and
    a transmission section that transmits the data outputted by said transmission data output section, the inversion instruction signal being outputted by said instruction signal output section and the error correcting code to said reception circuit,
        wherein said reception circuit comprises:
            an error code correction section that performs an error code correction for the data and inversion instruction signal transmitted from said transmission circuit using the error correcting code transmitted from said transmission circuit; and a received data output section that outputs the data for which the error code correction has been performed, with the polarity of each bit inverted, if the inversion instruction signal for which the error code correction has been performed indicates that the number of the changed bits has exceeded the threshold and, otherwise, outputs the data for which the error code correction has been performed, wherein said judgment section uses a value corresponding to half a width of the inputted data as the threshold, wherein said judgment section judges whether the data has changed by comparing, for said each bit, the inputted data with what is obtained by delaying the inputted data by one clock at said transmission data output section, wherein said judgment section compares, between the inputted data and the data outputted from transmission data output section, each pair of corresponding bits of an n-bit width data, where n is an integer, and wherein, if a total number of pairs of bits different from each other exceeds n/2 as a result of a comparison, said judgment section generates and outputs "1" as the inversion instruction signal, and if the total number of pairs of bits different from each other is equal to or below n/2 as a result of the comparison, said judgment section generates and outputs "0" as the inversion instruction signal.

2. The data transmission system according to claim 1, wherein said error code giving section gives the error correcting code using a hamming code.

3. The data transmission system according to claim 1, wherein said judgment section generates the inversion instruction signal at a high level if the number of the changed bits has exceeded the threshold and, otherwise, generates the inversion instruction signal at a low level, and wherein said transmission data output section outputs an exclusive-OR of the data and the inversion instruction signal.

4. A transmission circuit that transmits predetermined data to a reception circuit, the transmission circuit comprising:

a judgment section that generates a 1-bit width inversion instruction signal indicating whether or not a number of bits at which data has changed at a same time, among inputted 64-bit width data, has exceeded a predetermined threshold;

a transmission data output section that outputs the data, with a polarity of each bit inverted, if the inversion instruction signal indicates that the number of the changed bits has exceeded the threshold and, otherwise, outputs the data without inverting the polarity;

an instruction signal output section that outputs the inversion instruction signal at a timing of the output from said transmission data output section;

an error code giving section that gives a 7-bit width error correcting code to the data outputted by said transmission data output section and to the inversion instruction signal outputted by said instruction signal output section; and a transmission section that transmits the data outputted by said transmission data output section, the inversion instruction signal being outputted by said instruction signal output section and the error correcting code to said reception circuit, wherein said judgment section uses a value corresponding to half a width of the inputted data as the threshold, wherein said judgment section judges whether the data has changed by comparing, for said each bit, the inputted data with what is obtained by delaying the inputted data by one clock at said transmission data output section, wherein said judgment section compares, between the inputted data and the data outputted from transmission data output section, each pair of corresponding bits of an n-bit width data, where n is an integer, and wherein, if a total number of pairs of bits different from each other exceeds n/2 as a result of a comparison, said judgment section generates and outputs "1" as the inversion instruction signal, and if the total number of pairs of bits different from each other is equal to or below n/2 as a result of the comparison, said judgment section generates and outputs "0" as the inversion instruction signal.

5. A reception circuit that receives data transmitted from a transmission circuit that transmits data, the reception circuit comprising:

an error code correction section that performs an error code correction for 64-bit width data transmitted from said transmission circuit and a 1-bit width inversion instruction signal indicating whether or not a number of bits at which the data has changed at a same time has exceeded a predetermined threshold, using a 7-bit width error correcting code transmitted from said transmission circuit; and a received data output section that outputs the data for which the error code correction has been performed, with a polarity of each bit inverted, if the inversion instruction signal for which the error code correction has been performed indicates that the number of the changed bits has exceeded the threshold and, otherwise, outputs the data for which the error code correction has been performed, wherein said error code correction section uses a value corresponding to half a width of the data transmitted as the threshold, wherein said error code correction section judges whether the data has changed by comparing, for said each bit, the data transmitted with what is obtained by delaying the data transmitted by one clock at said received data output section, wherein said error code correction section compares, between the data transmitted and the data outputted from received data output section, each pair of corresponding bits of an n-bit width data, where n is an integer, and wherein, if a total number of pairs of bits different from each other exceeds n/2 as a result of a comparison, said error code correction section generates and outputs "1" as the inversion instruction signal, and if the total number of pairs of bits different from each other is equal to or below n/2 as a result of the comparison, said error code correction section generates and outputs "0" as the inversion instruction signal.

6. The data transmission system according to claim 1, wherein the 7-bit width error correcting code is given to a 65-bit width data.

7. The data transmission system according to claim 1, wherein the 7-bit width error correcting code is given to a 65-bit width data including the inversion instruction signal.

8. The data transmission system according to claim 1, wherein the 7-bit width error correcting code is given to a 65-bit width data including the inversion instruction signal such that 72 bits are transmitted.

9. The data transmission system according to claim 1, wherein, for a 64-bit width signal, an Error Checking and Correction (ECC) signal is suppressed to be a 7-bit signal to provide one surplus bit.

10. The transmission circuit according to claim 4, wherein the 7-bit width error correcting code is given to a 65-bit width data.

11. The transmission circuit according to claim 4, wherein the 7-bit width error correcting code is given to a 65-bit width data including the inversion instruction signal.

12. The transmission circuit according to claim 4, wherein the 7-bit width error correcting code is given to a 65-bit width data including the inversion instruction signal such that 72 bits are transmitted.

13. The transmission circuit according to claim 4, wherein, for a 64-bit width signal, an Error Checking and Correction (ECC) signal is suppressed to be a 7-bit signal to provide one surplus bit.

14. The transmission circuit according to claim 4, wherein said judgment section uses a value corresponding to half a width of the inputted data as the threshold.

15. The reception circuit according to claim 5, wherein the 7-bit width error correcting code is given to a 65-bit width data.

16. The reception circuit according to claim 5, wherein the 7-bit width error correcting code is given to a 65-bit width data including the inversion instruction signal.

17. The reception circuit according to claim 5, wherein the 7-bit width error correcting code is given to a 65-bit width data including the inversion instruction signal such that 72 bits are transmitted.

18. The reception circuit according to claim 5, wherein, for a 64-bit width signal, an Error Checking and Correction (ECC) signal is suppressed to be a 7-bit signal to provide one surplus bit.

19. The reception circuit according to claim 5, wherein said error code correction section uses a value corresponding to half a width of inputted data as the threshold.

* * * * *